United States Patent [19]

Tanizawa

[11] Patent Number: 4,761,572
[45] Date of Patent: Aug. 2, 1988

[54] SEMICONDUCTOR LARGE SCALE INTEGRATED CIRCUIT WITH NOISE CUT CIRCUIT

[75] Inventor: Tetsu Tanizawa, Kawasaki, Japan

[73] Assignee: Fujitsu Limited, Kanagawa, Japan

[21] Appl. No.: 25,709

[22] Filed: Mar. 13, 1987

[30] Foreign Application Priority Data

Mar. 15, 1986 [JP] Japan ................... 61-56074

[51] Int. Cl.⁴ .................... H03K 5/00; H03B 1/04
[52] U.S. Cl. .................... 307/546; 307/555; 307/557; 307/443
[58] Field of Search ............ 307/200 A, 443, 557, 307/555, 546, 542, 268, 572, 296.4; 328/165

[56] References Cited

U.S. PATENT DOCUMENTS

| | | | |
|---|---|---|---|
| 4,110,698 | 8/1978 | Petrie | 328/164 |
| 4,255,712 | 3/1981 | Petrie | 328/162 |
| 4,587,445 | 5/1986 | Kanuma | 307/443 |
| 4,667,337 | 5/1987 | Fletcher | 377/41 |

Primary Examiner—Stanley D. Miller
Assistant Examiner—Richard Roseen
Attorney, Agent, or Firm—Armstrong, Nikaido, Marmelstein & Kubovcik

[57] ABSTRACT

In a semiconductor large scale integrated circuit including a plurality of input terminals, sequential circuits and output buffer circuits, and further comprising a noise cut circuit, the semiconductor large scale integrated circuit comprises: a sense amplifier connected to an input terminal of the output buffer circuit for detecting a change of signal level at the input terminal and for generating an edge detection signal; a pluse generator connected to the sense amplifier for outputting a trigger pulse signal having a predetermined pulse width based on a plurality of the edge detection signals; and at least one tri-state circuit connected between the input terminal and the sequential circuit, and having a control terminal for receiving the trigger pulse signal for obtaining a high impedance state at an output line of the tri-state circuit during a predetermined period based on the trigger pulse signal input from the pulse generator.

6 Claims, 6 Drawing Sheets

SEMICONDUCTOR LARGE SCALE INTEGRATED CIRCUIT WITH NOISE CUT CIRCUIT

BACKGROUND OF THE INVENTION

1. Field of the Invention

The present invention relates to a semiconductor large scale integrated (LSI) circuit with a noise cut circuit.

2. Description of the Related Art

Recently, developments in LSI circuit techniques have enabled many LSI circuits to be put to practical use. There are, however, many problems in this practical use of LSI's, and one of these problems is to provide countermeasures against noise. Although there are many factors in the occurrence of noise, one of the main causes is switching of the circuit. For example, when output buffer circuits connected in parallel in the LSI circuit are sequentially switched, a large rush current flows from the output terminal to a power source line or a ground line. Since this rush current is a temporary flow on the line, the potential of the power source line or the ground line fluctuates so that the level of an input terminal of the LSI circuit also fluctuates. This fluctuation of the input level results in noise, and thus errors in the operation of the LSI circuit.

As countermeasures to noise, noise elimination or noise suppression techniques have been disclosed. These techniques, however, can not provide sufficient noise countermeasures for a CMOS (complementary MOS) LSI and TTL (transistor-transistor-logic) LSI.

SUMMARY OF THE INVENTION

The object of the present invention is to provide a semiconductor large integrated circuit with a noise cut circuit enabling spike noise caused by fluctuation of potential of a power source line or ground line to be cut.

In accordance with the present invention, there is provided a semiconductor large scale integrated circuit including a plurality of input terminal sequential circuits and output buffer circuits, and further comprising a noise cut circuit comprising:

a sense amplifier connected to an input terminal of said output buffer circuit for detecting a change of signal level at said input terminal and for generating an edge detection signal;

a pulse generator connected to said sense amplifier for outputting a trigger pulse signal having a predetermined pulse width based on a plurality of said edge detection signals; and at least one tri-state circuit connected between said input terminal and the sequential circuits, and having a control terminal for receiving said trigger pulse signal, for obtaining a high impedance state at an output line of said tri-state circuit during a predetermined period based on said trigger pulse signal input from said pulse generator.

DESCRIPTION OF THE PREFERRED EMBODIMENTS

Before describing the preferred embodiments, an explanation will be given of noise occurrence caused by potential fluctuation on the ground line.

Figure 1:
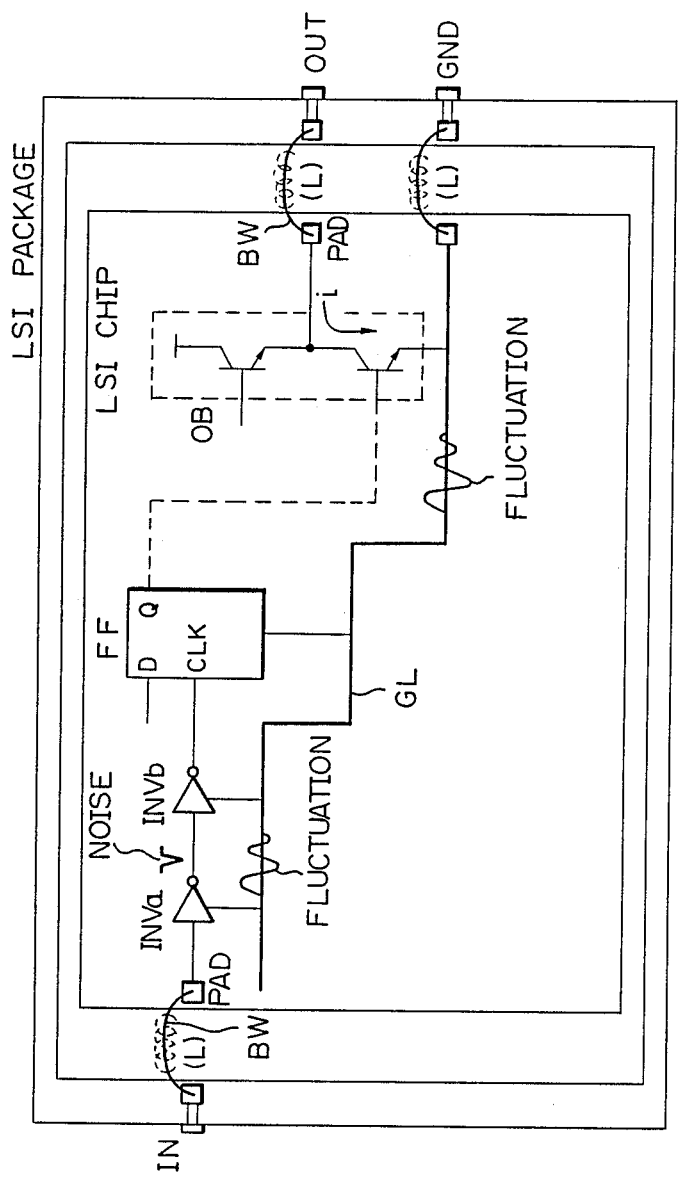
FIG. 1 is a schematic block diagram of a conventional LSI circuit for explaining fluctuation of a potential of a ground line and noise caused by this fluctuation.

In FIG. 1, sequential circuits, for example, flip-flop circuits FF (only one is shown in FIG. 1), are provided in the LSI chip. In an output stage, an output buffer circuit OB has two output transistors and is provided to amplify the logic signal to a level necessary for the next external stage. An output of the flip-flop circuit FF is connected to an input of the output buffer OB.

The output of the output buffer OB is connected to an output terminal OUT through a bonding pad PAD and a bonding wire BW. The output terminal OUT is provided in an LSI package. An input terminal IN is also connected to an input stage, for example, an inverter INVa, through the bonding pad PAD and the bonding wire BW.

These circuits from the input stage to the output stage have a common ground line GL. In this case, fluctuations of the potential caused by switching of the output buffer OB occur on the ground line GL as switching noise. The occurrence of this noise is explained as follows.

When the output level of the output buffer OB is changed from a high level to a low level, a large current i flows from the output terminal OUT to the ground line GL. This large current also flows to the bonding wire BW. In this case, since the bonding wire BW has an inductance component (L), fluctuations of the potential occur based on resonance under the inductance component and the large current. These fluctuations of the potential are propagated to the input stage through the ground line GL.

In the input stage, assuming that the input signal level of the inverter INVa is at a low level, the output level of the inverter INVa is at a high level when the potential fluctuations do not occur. However, when the fluctuations are applied to the input with the low level input signal, the output level of the inverter INVa is temporarily changed from the high level to the low level. This is because the input level becomes apparently high, based on the difference between the steady low signal level from the outside and the minus peak of the potential fluctuation. When this low level output from the inverter INVa caused by noise is input to, for example, the clock terminal CLK of the flip-flop circuit FF through the inverter INVb, errors occur in the flip-flop operations. Accordingly, since the sequential circuit is constituted by a plurality of flip-flop circuits, errors occur in the connected flip-flop circuits.

A semiconductor large scale integrated circuit with a noise cut circuit according to the present invention will be explained in detail hereinafter.

Figure 2:
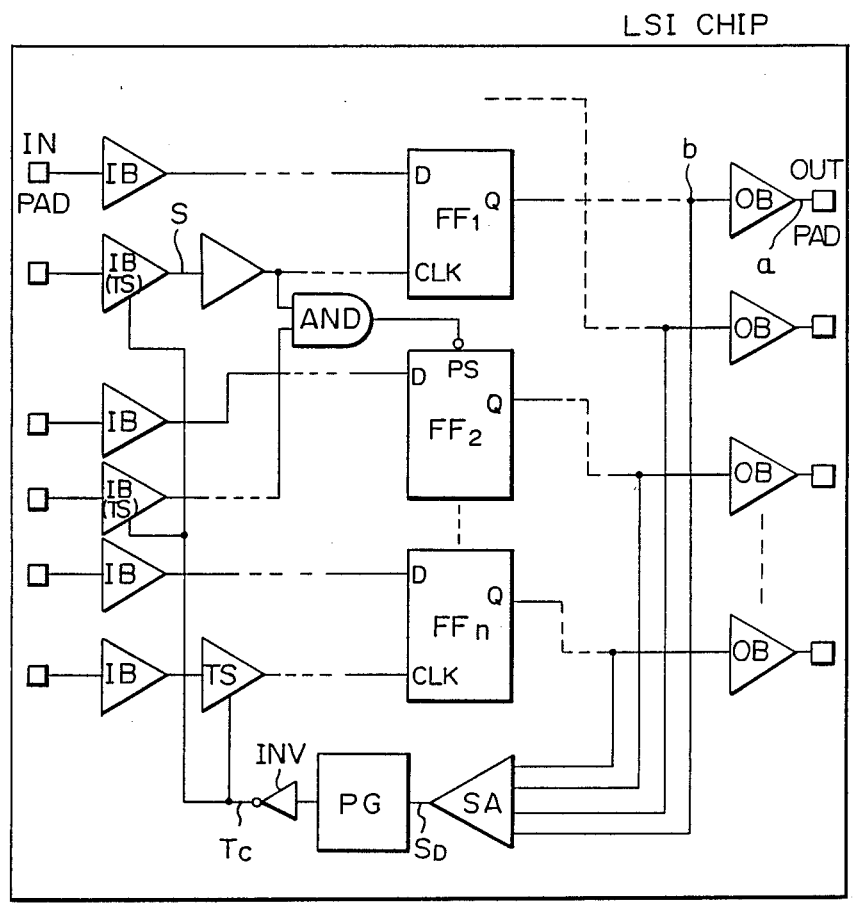
FIG. 2 is a schematic block diagram of an LSI circuit with a noise cut circuit according to an embodiment of the present invention.

In FIG. 2, a plurality of flip-flop circuits $FF_1$ to $FF_n$ are provided in the LSI chip as the sequential circuit. Each of outputs of the flip-flop circuit $FF_1$ to $FF_n$ is connected to a corresponding output buffer OB, and a plurality of input buffers IB, for example, inverters, in addition to that of FIG. 1, are provided in the input stage.

These flip-flop circuits and output buffers have the same component structure as that of FIG. 1, and accordingly, the ground line GL shown in FIG. 1 is provided in this circuit but is not shown, in order to simplify the drawing. This LSI chip is also provided in the LSI package. Accordingly, the output buffer OB is connected to the output terminal through the bonding wire as in FIG. 1.

The noise cut circuit according to the present invention is constituted by a sense amplifier SA, a pulse generator PG and a plurality of tri-state circuits TS and IB(TS).

As is obvious from the drawing, the noise cut circuit is provided between the output stage and the input stage. That is, the input of the sense amplifier SA is connected to the input of the output buffer OB, and the output of the pulse generator PG is connected to the tri-state circuit TS through the inverter INV. The tri-state circuit TS can be provided at any optional position in the input stage as shown by IB(TS).

The basic operations of the noise cut circuit according to the present invention will be explained below. When the input level of the output buffer OB is changed, for example, from a high level to a low level as shown by (a) in FIG. 7, the output level of the output buffer OB is also changed from the high level to the low level after a short delay D as shown by (b) in FIG. 7. As explained above, the fluctuation of the potential caused by a large current flow when the output level is changed occurs in the ground line GL as shown in FIG. 7.

In the present invention, the sense amplifier SA detects the trailing edge of the waveform (a). That is, the sense amplifier SA detects the change of level at the input side of the output buffer OB as explained in detail hereinafter. The pulse generator PG generates a trigger pulse signal shown by $T_C$ in FIG. 7 based on the edge detection signal $S_D$ from the sense amplifier SA. The pulse signal Tc is delayed in Do from the change of input signal (a) according to the propagation delay time of the sense acuplifier SA, the pulse generator PG, and the inventer INV. The delay time Do should be equal to or shorter than the short delay D. The pulse signal has a predetermined pulse width d0 which is approximately equal to or larger than a noise occurrence time α explained in detail hereinafter. The pulse signal Tc is input to the tri-state circuit TS. The output of the tri-state circuit TS is brought to a high impedance state during this pulse width d0. In this period, noise is not propagated (cut) to the flip-flop circuit FF even though fluctuation of the potential occurs on the ground line GL. In this case, the pulse width d0 is approximately equal to the high impedance period of the tri-state circuit TS. The high impedance period is a blanking period for noise propagation. However, the signal can be held during the high impedance period as explained in detail in FIG. 8. As shown in FIG. 2, the tri-state circuit TS can be provided not only at the input buffer IB stage, but also at the stage after the input buffer IB and before the flip-flop circuit. Moreover, the output signal from the tri-state circuit TS can be input not only to a clock input terminal CLK, but also to a pre-set terminal PS in the flip-flop circuit. These terminals are used as control signal input terminals of the flip-flop circuit. This is because these kind of inputs affect the internal state of the flip-flop circuit, and if noise accompanies these inputs, the internal state of the flip-flop is changed. As explained above, the tri-state circuit TS can be provided at an optional sequential circuit route which is largely effected to the internal state of the flip-flop circuit. The flip-flop circuit is a sequential circuit having a memory function.

Figure 3:
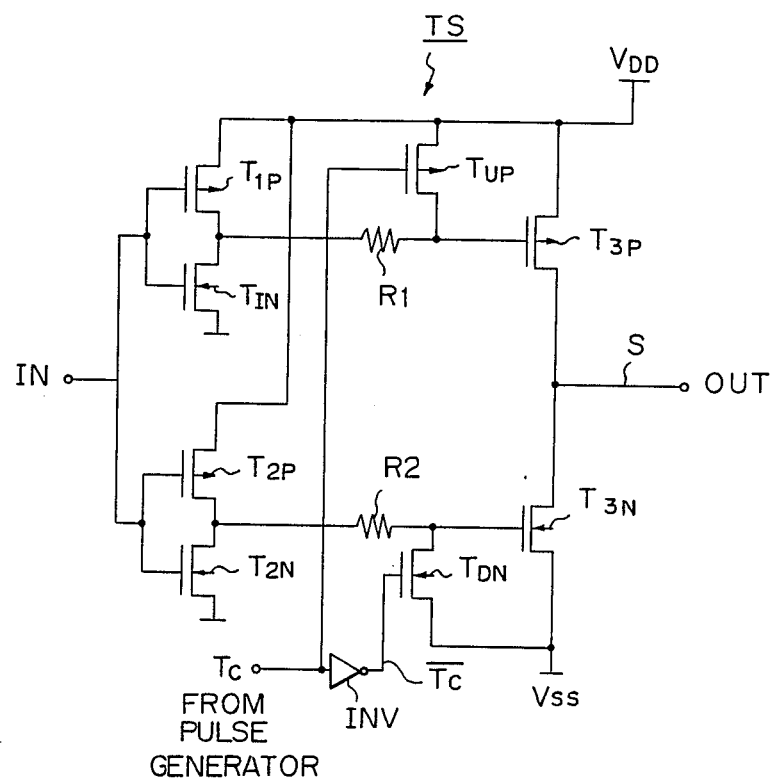
FIG. 3 is a circuit diagram of a tri-state circuit shown in FIG. 2.

In FIG. 3, this tri-state circuit TS is constituted by a plurality of P-channel and N-channel CMOS transistors $T_{1P}$, $T_{1N}$, $T_{2P}$, $T_{2N}$, $T_{UP}$, $T_{DN}$, $T_{3P}$, and $T_{3N}$. R1 and R2 are current limitation resistors for preventing a large current flow from the transistors $T_{UP}$ and $T_{DN}$ to the input state when the tri-state circuit is activated. $T_C$ is a trigger pulse signal transmitted from the pulse generator PG, as explained above.

Figure 7:
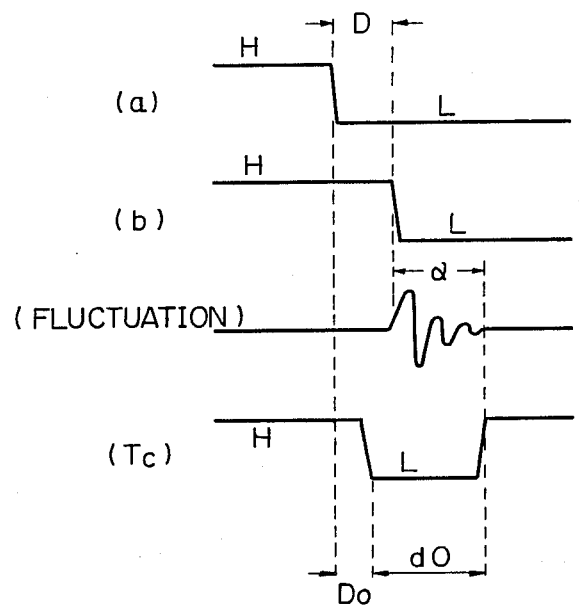
FIG. 7 shows waveforms for explaining relationships among a level change of an input signal, fluctuation of a potential, and trigger pulse.
Figure 8:
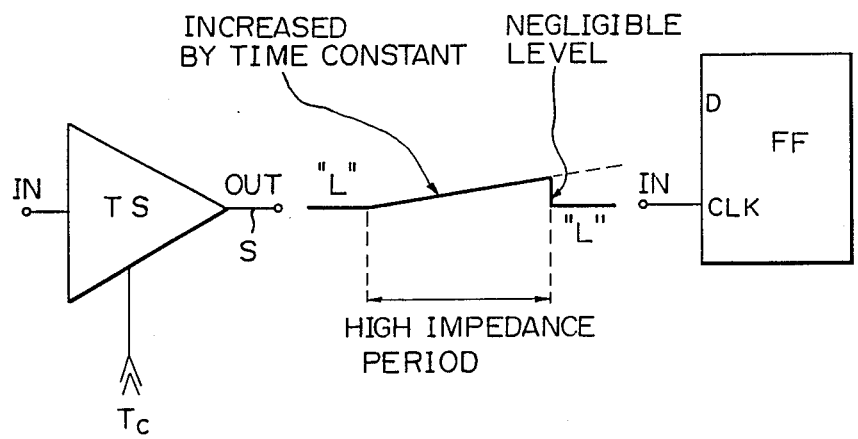
FIG. 8 is a view for explaining a high impedance period of an output of the tri-state circuit shown in FIG. 3.

When the low level trigger input signal $T_C$ as shown by (Tc) in FIG. 7 is input to the input of the inverter INV, the P-channel transistor $T_{UP}$ is turned ON and the N-channel transistor $T_{DN}$ is also turned ON because the output $T_C$ of the inverter INV is at a high level. Accordingly, the P-channel transistor $T_{3P}$ and the N-channel transistor $T_{3N}$ are turned OFF because the gate of the transistor $T_{3P}$ becomes high level and the gate of the transistor $T_{3N}$ becomes low level. Since both transistors $T_{3P}$ and $T_{3N}$ are turned OFF, the output of this circuit is at a high impedance. In this case, the impedance of the output line S of the tri-state circuit TS is defined by a line capacitor and input impedance of the next stage. In general, a CMOS circuit or PNP input TTL circuit in the flip-flop circuit has a high input impedance. Therefore, the time constant of the output line S becomes very large, for example, several hundred nano-seconds to several milli-seconds, as shown in FIG. 8. Accordingly, during the high impedance state, the level change of the output line is negligible as shown in FIG. 8. Therefore the signal is held even if the tri-state circuit TS is activated.

Moreover, when the input level is inverted by the fluctuation of the ground line, an original output signal is maintained based on this large time constant under a high impedance state. In FIG. 8, the signal is "L" level on the output line S. When the tri-state circuit TS is activated, the output is at a high impedance. However, since the time constant becomes large, the change of the "L" level is very small and negligible.

Further, when the tri-state circuit TS in not activated, both transistors $T_{UP}$ and $T_{DN}$ are turned OFF. Therefore, in a normal state, once the input signal is inverted by transistors $T_{1P}$ and $T_{1N}$, and transistors $T_{2P}$ and $T_{2N}$, these inverted signals are inverted again by the transistors $T_{3P}$ and $T_{3N}$. Consequently, the same phase as the input signal can be output from the tri-state circuit TS.

Figure 4:
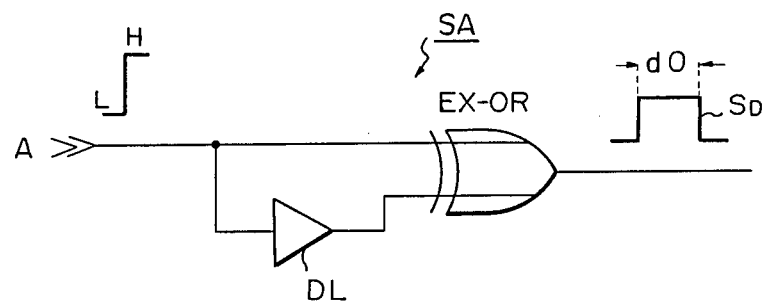
FIG. 4 is a edge detection circuit diagram in a sense amplifier shown in FIG. 2.

In FIG. 4, this circuit is provided in the sense amplifier SA and used for detecting the leading edge or trailing edge of an input signal A and for outputting an edge detection signal d0. Reference letter DL denotes a delay circuit, and EX-OR denotes an exclusive-OR circuit. The operations of this circuit are as follows. When the input signal is "L" level, the "L" level signal is directly input to one input terminal of the EX-OR circuit, and a delayed "L" level signal is input to the other input terminal of the EX-OR circuit through the delay circuit DL. In this case, the output of the EX-OR circuit becomes "L" level. Next, when the input signal A is changed, for example, from "L" level to "H" level, the high level signal is directly input to one input terminal of the EX-OR circuit. At this time, the other input terminal of the EX-OR circuit is "L" level, and after a short time (i.e., delayed time), it becomes "H" level. Accordingly, when one input is "H" level and the other input is "L" level, the EX-OR circuit outputs an "H" level signal. After a short time, when one input is "H" level and the other input is "H" level, the EX-OR circuit outputs an "L" level. Consequently, the edge detection signal $S_D$ is obtained from the output of the EX-OR circuit. The edge detection signal $S_D$ is input to the pulse generator PG. When the input signal A is changed from "H" level to "L" level, the same edge detection signal $S_D$ as above is obtained from the output of the EX-OR circuit.

Figure 5:
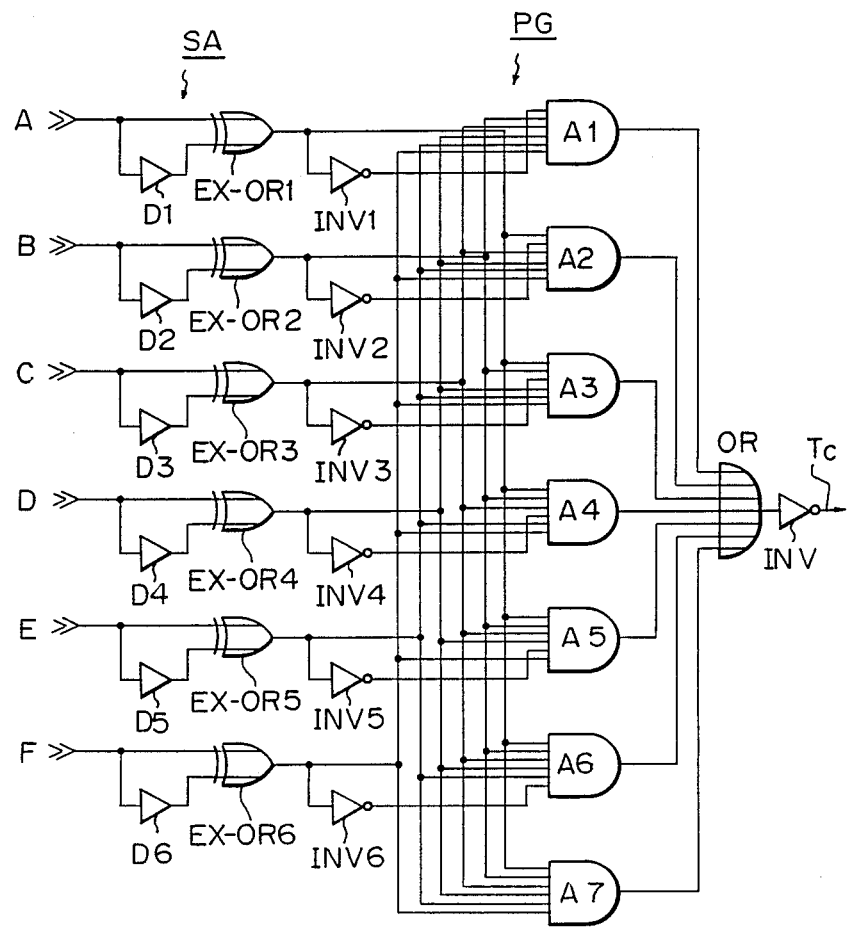
FIG. 5 is a schematic circuit block of a pulse generator shown in FIG. 2.

In FIG. 5, the left side denotes the edge detection circuits shown in FIG. 4. Accordingly, each EX-OR circuit outputs the edge detection signal $S_D$ when the level of the input signal is changed from "H" level to "L" level or from "L" level to "H" level. In FIG. 5, each of the input signals A to F corresponds to each input signal of the output buffer OB shown in FIG. 2. In this case, six input signals A to F are shown, and each of these input signals A to F is input in parallel to the pulse generator PG.

In this embodiment, the pulse generator PG generating the trigger pulse signal $T_C$ having a predetermined pulse width d0 is constituted by six inverters INV1 to INV6, seven AND gates AND1 to AND7, and an OR gate. The operations of this circuit are as follows. For example, when the level of the input signal A is not changed and signals B to F of another input level are changed, the inverted high level signal by the inverter INV1 is input to the AND gate A1. At the same time, the edge detection signal $S_D$ from each of the EX-OR circuits (EX-OR2 to EX-OR6) is also input to the AND gate A1. Accordingly, the high level signal is output from the AND gate A1 and is input to the OR gate. Consequently, the trigger pulse $T_C$ having the pulse width d0 is obtained from the pulse generator PG through the inverter INV. When the level of the input signal D is not changed and signals A to C and E to F of another input level are changed, as another example, the inverted high level signal by the inverter INV4 is input to the AND gate A4. At the same time, the edge detection signal $S_D$ from each of the EX-OR circuits (EX-OR1 to EX-OR3 and EX-OR5 to EX-OR6) is also input to the AND gate A4. Accordingly, the high level signal is output from the AND gate A4 and is input to the OR gate. Accordingly, the trigger pulse $T_C$ is output from the pulse generator PG through the inverter INV.

As is obvious from the above explanations, when the input levels of at least five input signals are changed, the trigger pulse $T_C$ having the pulse width d0 is output from the pulse generator PG. When all input signals are changed, edge detection signals $S_D$ from the EX-OR circuits are directly input to the AND gate A7. Accordingly, the high level signal as the trigger pulse $T_C$ is output through the OR gate and the inverter INV.

The pulse width of the trigger pulse $T_C$ is approximately equal to the delay time d0. Since this trigger pulse $T_C$ is input to the tri-state circuit TS as shown in FIG. 3, the delay time d0 is approximately equal to the high impedance period of the output of the tri-state circuit TS.

Figure 6:
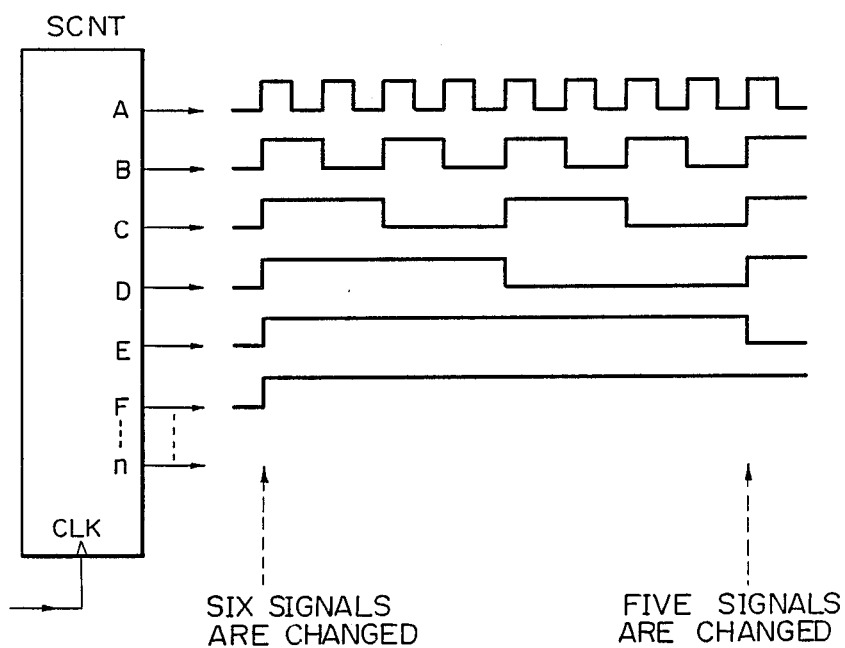
FIG. 6 shows a synchronous counter and various output signals.

In FIG. 6, SCNT denotes a synchronous counter provided in the sequential circuit for obtaining synchronous signals. Each of the output signals A to F corresponds to, for example, each of the input signals A to F shown in FIG. 5. As shown in FIG. 6, levels of all signals A to F are changed from "L" level to "H" level, and when the signal E is changed from "H" level to "L" level, other signals A to D are also changed from "L" level to "H" level, but the signal F is not changed. Accordingly, the level change of the signals A to D can be always caught by detection of the level change of the signal E.

I claim:

1. A semiconductor large scale integrated circuit including a pluraltiy of input terminals, sequential circuits and output buffer circuits connected to said sequential circuits, and further comprising a noise circuit comprising;

a sense amplifier connected to an input terminal of said output buffer circuit for detecting a change of signal level at said input terminal and for generating an edge detection signal in response thereto;

a pulse generator connected to said sense amplifier for outputting a trigger pulse signal having a predetermined pulse width in response to said edge detection signal from said sense amplifier; and at least one tri-state circuit connected between at least one of said input terminals and at least one of said sequential circuits, and having a control terminal for receiving said trigger pulse signal, for obtaining a high impedance state at an output line of said tri-state circuit during a predetermined period in response to said trigger signal input from said pulse generator.

2. A semiconductor large scale integrated circuit as claimed in claim 1, wherein said sense amplifier comprises an exclusive-OR gate receiving an input signal from said input terminal for generating said edge detection signal having a predetermined pulse width wherein a delay circuit is provided for delaying said input signal to one input of said exclusive-OR gate.

3. A semiconductor large scale integrated circuit as claimed in claim 2, wherein said pulse generator comprises a plurality of inverter circuits, and said sense amplifier comprises a plurality of said exclusive-OR gates and said delay circuits each inverter circuit connected to a corresponding output of one of said exclusive-OR gates, a plurality of AND gates a corresponding connected to each output of said inverter circuits and all noncorresponding said exclusive-OR gates, an additional AND gate connected to each output of said exclusive-OR gates, and an OR gate connected to the outputs of all of said AND gates for outputting said trigger pulse.

4. A semiconductor large scale integrated circuit as claimed in claim 1, wherein said tri-state circuit comprises a P-channel transistor to which said trigger pulse signal is applied and an N-channel transistor to which an inverted trigger pulse signal is applied, said P-channel transistor and said N-channel transistor simultaneously being turned ON in response to said trigger pulse signal and said inverted trigger pulse signal, for obtaining a high impedance state at said output line during a predetermined period.

5. A semiconductor large scale integrated circuit as claimed in claim 1, wherein said high impedance state of said tri-state circuit during said predetermined period cuts noise caused by a fluctuation of a potential of a ground line at said input terminals.

6. A semiconductor large scale integrated circuit as claimed in claim 1, wherein said sequential circuit comprises a flip-flop circuit having a control signal input terminal for receiving a control signal and changing the internal state thereof, said tri-state circuit having said output line operatively connected to said control signal input terminal.

* * * * *